(12) United States Patent
Srinivasan

(10) Patent No.: US 7,984,415 B1
(45) Date of Patent: Jul. 19, 2011

(54) MERGING OF EQUIVALENT LOGIC BLOCKS IN A CIRCUIT DESIGN

(75) Inventor: Sankaranarayanan Srinivasan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 353 days.

(21) Appl. No.: 12/395,404

(22) Filed: Feb. 27, 2009

(51) Int. Cl.
*G06F 17/50* (2006.01)
(52) U.S. Cl. .......... 716/139; 716/121; 716/128; 326/41
(58) Field of Classification Search .................. 716/121, 716/128, 139; 326/41
See application file for complete search history.

(56) References Cited

U.S. PATENT DOCUMENTS
2009/0128189 A1 * 5/2009 Madurawe et al. ............. 326/41

OTHER PUBLICATIONS

U.S. Appl. No. 11/805,954, filed May 25, 2007, Manaker et al.
U.S. Appl. No. 11/827,531, filed Jul. 12, 2007, Srinivasan et al.

* cited by examiner

*Primary Examiner* — Naum Levin
(74) *Attorney, Agent, or Firm* — LeRoy D. Maunu; Lois D. Cartier

(57) ABSTRACT

Approaches for merging replicate logic blocks of a circuit design. Groups of replicate logic blocks in a placed circuit design are determined. For the replicate logic blocks in each group, a determination is made whether or not to merge replicate logic blocks in a subset of the replicate logic blocks into a respective single replacement logic block for the subset. In response to determining to merge the replicate logic blocks in the subset, the replicate logic blocks in the subset are replaced in the circuit design with the respective replacement logic block. The circuit design having the replacement logic block is stored in a memory by a processor executing the process.

19 Claims, 11 Drawing Sheets

MERGING OF EQUIVALENT LOGIC BLOCKS IN A CIRCUIT DESIGN

FIELD OF THE INVENTION

The present invention generally relates to improving a circuit design by merging equivalent logic blocks.

BACKGROUND

Logic blocks of a circuit design are sometimes replicated in order to make certain improvements in the implemented design. For example, fanout-free regions of a logic cone may be created in order to apply combinatorial synthesis optimizations. In another example, a flip-flop may be replicated in order to reduce the number of outputs for a high-fanout signal. The replication of logic occurs in the logic synthesis stage.

With each replication, the fanout on the output side of the logic is reduced at the expense of an increased number of pins on the input side of the replicated logic. The replicate logic blocks may have a negative impact on circuit performance, because not all replicate logic blocks may be necessary and extra unnecessary blocks occupy circuit area and consume extra power.

Logic replication may create additional problems in designs targeted to programmable integrated circuits such as field programmable gate arrays (FPGAs). For example, in some FPGAs from XILINX®, Inc., each flip-flop in a slice needs to be driven by the same clock and control signals (the "control set"). Flip-flop replications may result in fitting problems due to the control set requirements.

The present invention may address one or more of the above issues.

SUMMARY

The embodiments of the invention provide methods and apparatus for merging replicate logic blocks in a circuit design. In one embodiment, a method determines groups of replicate logic blocks in a placed circuit design. The replicate logic blocks in each group have equivalent logic, corresponding input pins, and corresponding output pins. Each set of corresponding input pins is coupled to a common source. The method determines for the replicate logic blocks in each group, whether or not to merge replicate logic blocks in a subset of the replicate logic blocks into a respective single replacement logic block for the subset. In response to determining to merge the replicate logic blocks in the subset, the replicate logic blocks in the subset are replaced in the circuit design with the respective replacement logic block. The circuit design having the replacement logic block is stored.

In another embodiment, a system is provided for processing a circuit design. The system comprises a processor coupled to a memory. The memory is for storing a placed circuit design. The processor is programmed to perform the steps including determining groups of replicate logic blocks in the placed circuit design. The processor determines for the replicate logic blocks in each group, whether or not to merge replicate logic blocks in a subset of the replicate logic blocks into a respective single replacement logic block for the subset. In response to determining to merge the replicate logic blocks in the subset, the processor replaces in the circuit design replicate logic blocks in the subset with the respective replacement logic block. The processor then stores the circuit design having the replacement logic block.

An article of manufacture comprises a processor-readable storage medium configured with processor-executable instructions for processing a circuit design. The instructions when executed causes the processor to perform the steps including determining groups of replicate logic blocks in a placed circuit design. The processor determines for the replicate logic blocks in each group, whether or not to merge replicate logic blocks in a subset of the replicate logic blocks into a respective single replacement logic block for the subset. In response to determining to merge the replicate logic blocks in the subset, the replicate logic blocks in the subset are replaced in the circuit design with the respective replacement logic block. The circuit design having the replacement logic block is then stored.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The various embodiments of the invention provide approaches for merging replicate logic blocks based on placement information in order to improve performance, routability, and/or power consumption of a circuit design. Since replication is performed at the synthesis stage where there is not accurate information for interconnect delay, slack and delay cannot feasibly be used to remove replicate logic blocks. After a circuit design has been placed, that is, the logic has been mapped to particular circuit elements of a particular circuit technology, the replicate logic blocks are considered for merging. Performing the merging process during placement provides accurate delay information upon which merge decisions may be based.

Groups of equivalent logic blocks are determined from a placed circuit design. The blocks in each group have equivalent logic, corresponding input pins, and corresponding output pins. Each corresponding input pin of the replicate blocks in a group is coupled to a common source. Within each group of blocks, one or more subsets of the blocks in the group are considered for possibly merging into one or more corresponding single replacement logic blocks.

Whether or not the blocks in a subset are merged may be determined based on factors such as timing criticality, congestion, and/or power consumption. Wirelength may also be considered, if the circuit design has been routed. When the blocks in a subset are to be merged, all but one, the "replacement block," of the blocks in the subset are deleted from the design, with the output signal(s) suitably fanning out from the replacement block to replace the output signals from the deleted blocks.

Figure 1A:
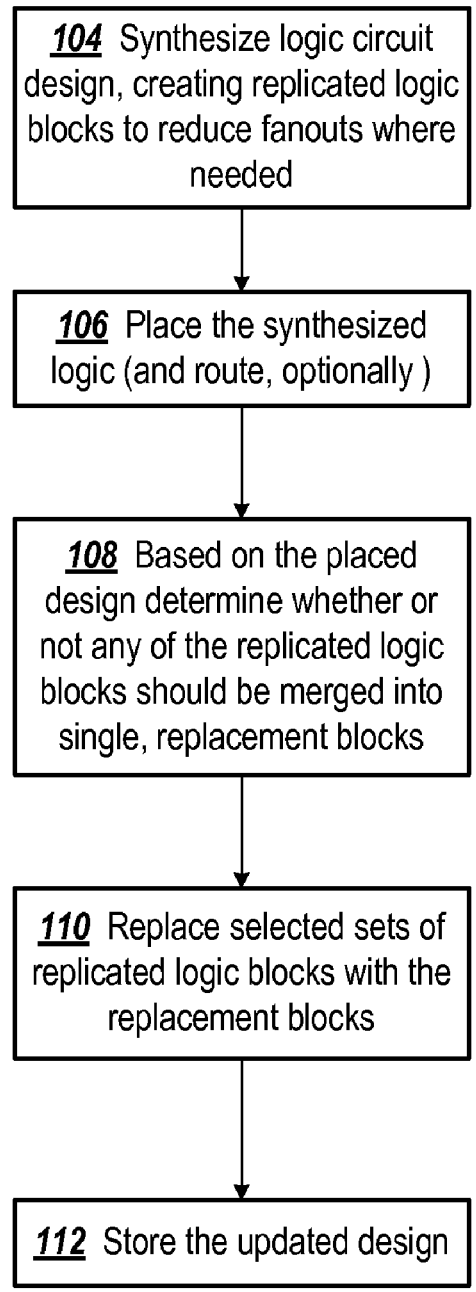
FIG. 1A is a flowchart of a process for processing a circuit design in accordance with various embodiments of the invention.

FIG. 1A is a flowchart of a process 100 for processing a circuit design in accordance with various embodiments of the invention. A circuit design is subjected to logic synthesis at step 104. For certain logic blocks of the design, the logic synthesis process creates replicate blocks in order to reduce fanouts, for example.

At step 106, the synthesized logic is mapped to technology-specific circuit elements and placed in particular locations or instances of those circuit elements of a device. For example, for an FPGA-targeted design logic blocks will be mapped to specific instances of lookup tables (LUTs) of a particular type of FPGA.

Based on the placed design, at step 108 the process determines whether or not any of the replicate logic blocks should be merged. Whether or not a logic block should be merged with one or more replicate logic blocks into a single block may be determined based on characteristics of the circuit design including the resulting single block. For example, a combination of one or more factors such as timing criticality, congestion, power consumption, and wire length may be considered. Timing criticality refers to the slack value determined for an input signal to a block (e.g., the difference between the arrival times of the input signal relative to a clock signal). Congestion refers to demand for routing resources in a particular region. Power consumption refers to the dynamic power usage based on the capacitance and switching activity for the logic blocks and networks in the design. The wire length characteristic refers to wire usage for the networks in the design. Different models for wire length such as half-perimeter wire length or minimum spanning tree algorithms may be used for wire length estimation.

For each case where merging is determined to be beneficial, the design information is modified such that the single replacement block replaces the replicate logic blocks, as shown by step 110. The replicate blocks are deleted from the design, as are input connections to those replicate blocks. The design information is also updated to fanout each output connection from the single replacement block to the blocks formerly receiving the output from the deleted replicate blocks. At step 112, the updated design information is stored for further processing.

Figure 1B:
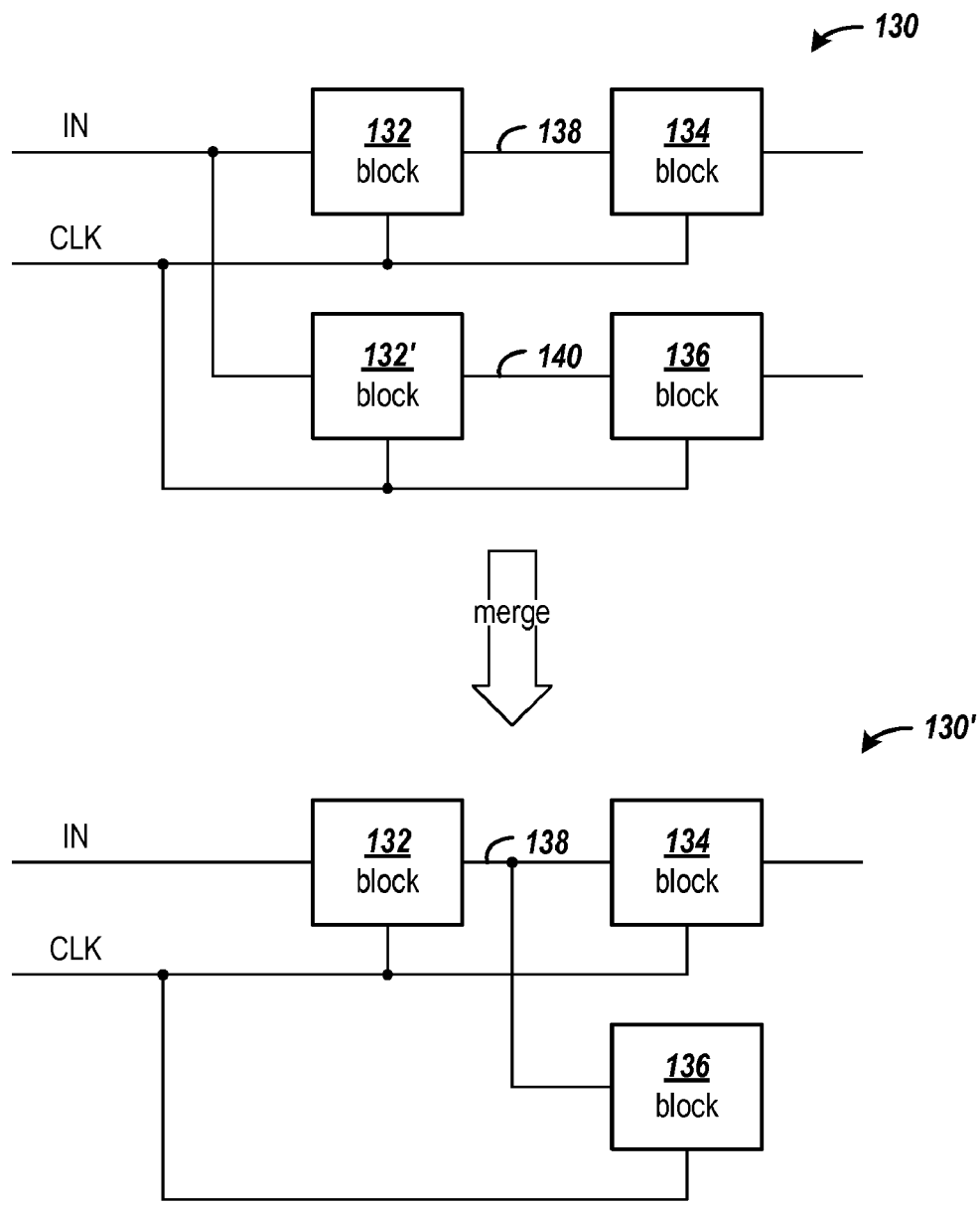
FIG. 1B is a block diagram that illustrates a first partial circuit design with an example replicate logic block, and a second partial circuit design that results from the merging of equivalent logic blocks into a single logic block.

FIG. 1B is a block diagram that illustrates a partial circuit design 130 with an example replicate logic block, and a partial circuit design 130' that results from the merging of equivalent logic blocks into a single logic block. Logic blocks 132 and 132' are individual instances of equivalent logic blocks in circuit 130, and logic blocks 134 and 136 receive output from blocks 132 and 132', respectively.

Prior to logic synthesis, a user's design may have included block 132 with the output signal 138 connected to inputs of both blocks 134 and 136 (as is the case following the merge as shown in circuit 130'). As explained previously, logic synthesis may have introduced logic block 132' as a replicate of logic block 132 for purposes of optimizing the circuit design. The introduction of replicate block 132' reduces the fanout from the block 132; instead of block 132 connecting to the inputs of both of blocks 134 and 136, the output of block 132 connects only to block 134, with replicate block 132' providing the input to block 136.

After the design containing circuit 130 has been placed and accurate interconnect delay information is available, the design is further processed to eliminate replicate logic that is not beneficial to the overall design. In the example of FIG. 1B, replicate block 132' is merged with block 132, resulting in circuit design 130'. As part of the merge, the output signal 138 of block 132 is connected to block 136 in place of the output 140 formerly provided by block 132'.

Figure 2:
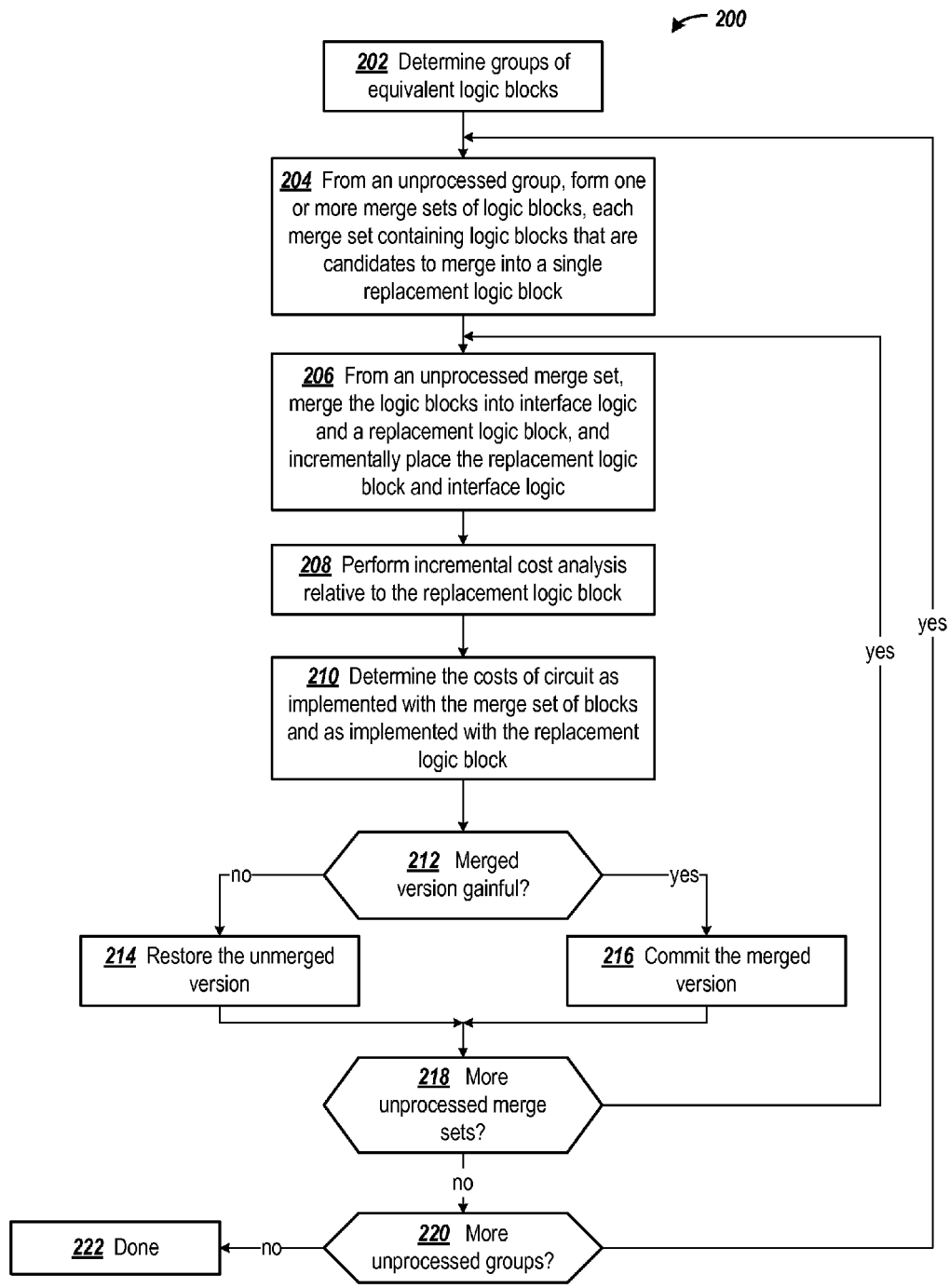
FIG. 2 is a flowchart of an example process for determining logic blocks to merge in accordance with various embodiments of the invention.

FIG. 2 is a flowchart of an example process for determining logic blocks to merge in accordance with various embodiments of the invention. The process generally entails determining groups of equivalent logic blocks, and within each group determining which blocks to merge. Within a group, different combinations of blocks are considered for merging, and multiple subsets of blocks within a group may be merged, depending on the desirability of those merges.

At step 202, the process determines the groups of equivalent logic blocks. Those skilled in the art will recognize various approaches for determining equivalent logic blocks. For example, combinatorial equivalence checking or sequential equivalence checking may be used to determine the groups. Alternatively, or in combination with the equivalence checking, replicate logic blocks that were generated during logic synthesis may be tagged to indicate the associated source block from which the replicas were made. For example, a logic block, FF2, may be tagged with, "SOURCE=FF1." The groups of equivalent logic blocks may be determined by way grouping the logic blocks according to the tags.

Each of the groups is processed beginning at step 204. Within each group, merge sets are formed and a prospective merging of the blocks within each merge set is evaluated. Each merge set contains a subset of the blocks within a group, and the blocks in the subset are those considered for merging into a single block. Different approaches for forming the merge sets are shown in FIGS. 3-6C and described below. Each of the merge sets within a group is processed beginning at step 206. Generally, the blocks in a merge set are provisionally merged and if the single block is more beneficial to the design than are the unmerged blocks in the merge set, the single block is committed to the design.

At step 206, the blocks in the merge set are merged into a provisional replacement block and suitable interface logic is created to establish the connections required for the replacement block to replace the other blocks in the merge set. The replacement block is also incrementally placed, meaning that no other parts of the design need to be re-placed.

At step 208, incremental cost analysis is performed on the changed "region" of the circuit design, i.e., that part of the circuit design having the replacement logic block. In an example embodiment, the incremental cost analysis may be an incremental timing analysis for the pins of the replacement block (computing new slack values, including new slack values for the pins of the blocks receiving outputs of the replacement block). In addition, the incremental cost analysis also evaluates slack value changes to the input side of the replacement logic block along with fanout increases.

The cost of the entire circuit design including the provisional replacement block, and the cost of the circuit design including the un-merged blocks in the merge set, are determined at step 210. The cost function may include metrics such as wire length, timing criticality, congestion, power consumption, and others. If the version of the design having the unmerged blocks in the merge set ("unmerged version") has a better cost metric than does the version of the design containing the provisional replacement block ("merged version"), as checked at decision step 212, the unmerged version is restored at step 214. Otherwise, the merged version of the circuit design is committed at step 216. The restoring of the unmerged version stores, for the next iteration of the process, the circuit design having the unmerged blocks in the merge set. The committing of the merged version stores, for the next iteration of the process, the circuit design having the provisional replacement block in place of the blocks in the merge set.

Decision step 218 checks whether or not there are more merge sets to process in the current group. If so, the process returns to step 206 to begin processing of an unprocessed merge set. Otherwise, the process at decision step 220 checks whether or not there are more unprocessed groups of equivalent logic blocks in the design. If there are more groups to process, the process returns to step 204. Otherwise, at step 222 the process is complete. Note that the updated design resulting from process 200 was stored in either of steps 214 or 216.

Figure 3:
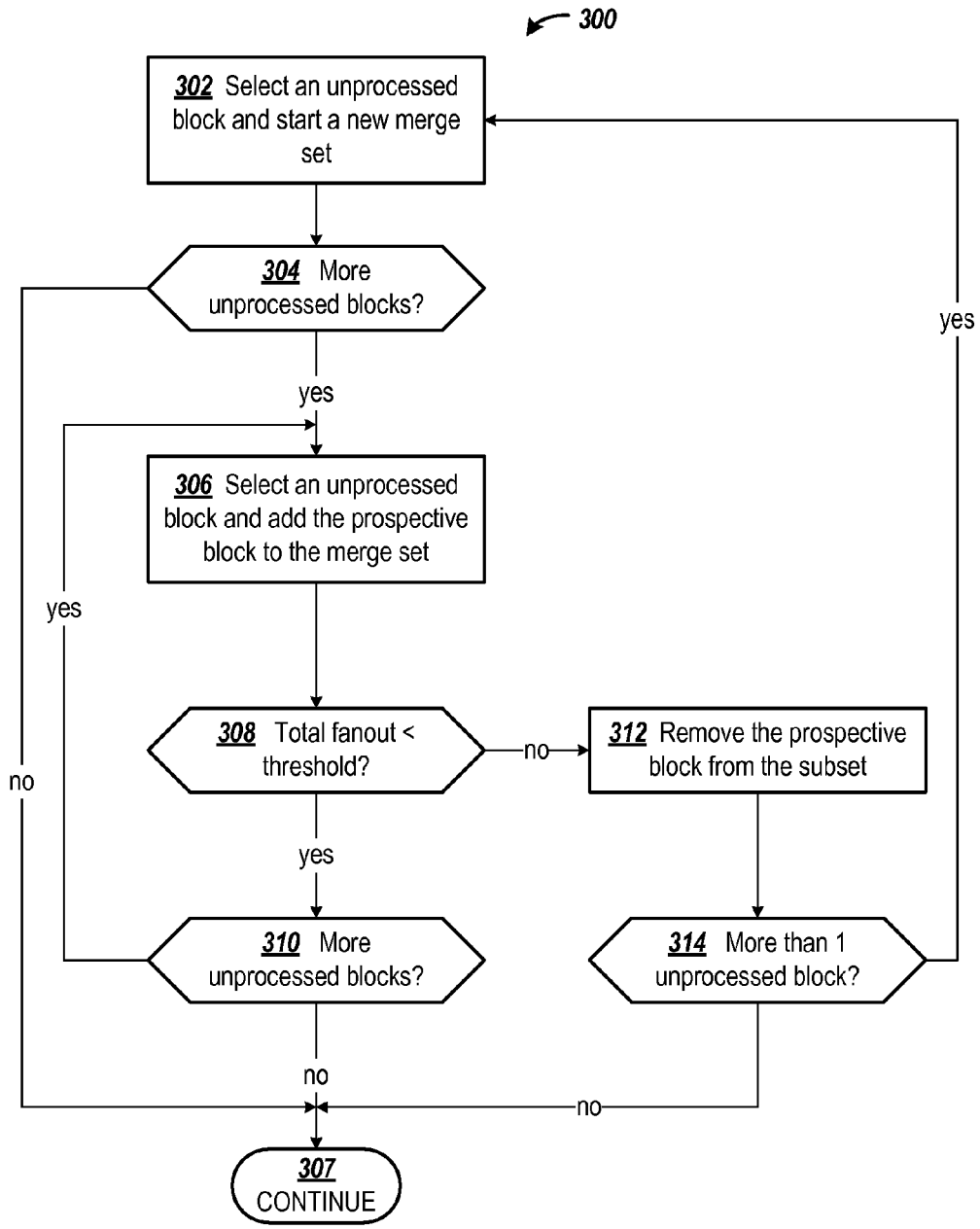
FIG. 3 is a flowchart of an example process that uses a fanout threshold in constructing merge sets within a group of equivalent logic blocks.

FIG. 3 is a flowchart of an example process 300 that uses a fanout threshold in constructing merge sets within a group of equivalent logic blocks. The process 300 is one example implementation of step 204 in FIG. 2. The process generally entails adding blocks to a merge set until a fanout threshold is reached and then starting a new merge set.

At step 302, the process selects an unprocessed block in the group and starts a new merge set. If there are more unprocessed blocks in the group, decision step 304 directs the process to step 306 where an unprocessed block is selected and prospectively added to the merge set. If there are no more unprocessed blocks, the process is directed to step 307, which continues the overall process of FIG. 2.

Decision step 308 considers the fanout of a replacement block which would result from merging the blocks currently in the merge set. If the total fanout of the replacement block is less than some desired threshold, the process proceeds to decision step 310 to check whether or not there are more unprocessed blocks in the group to be considered for adding to the current merge set. If there are more unprocessed blocks to consider adding to the merge set, the process returns to step 306. Otherwise, the process continues at step 307 as described above.

If at decision step 308 the total fanout is not less than the desired threshold, the prospective block is removed from the merge set at step 312. Since the current merge set is complete, decision step 314 then checks whether or not there is more than one unprocessed block remaining in the group. If so, the process returns to step 203 to start a new merge set. Otherwise, the process continues at step 307 as described above.

Figure 4:
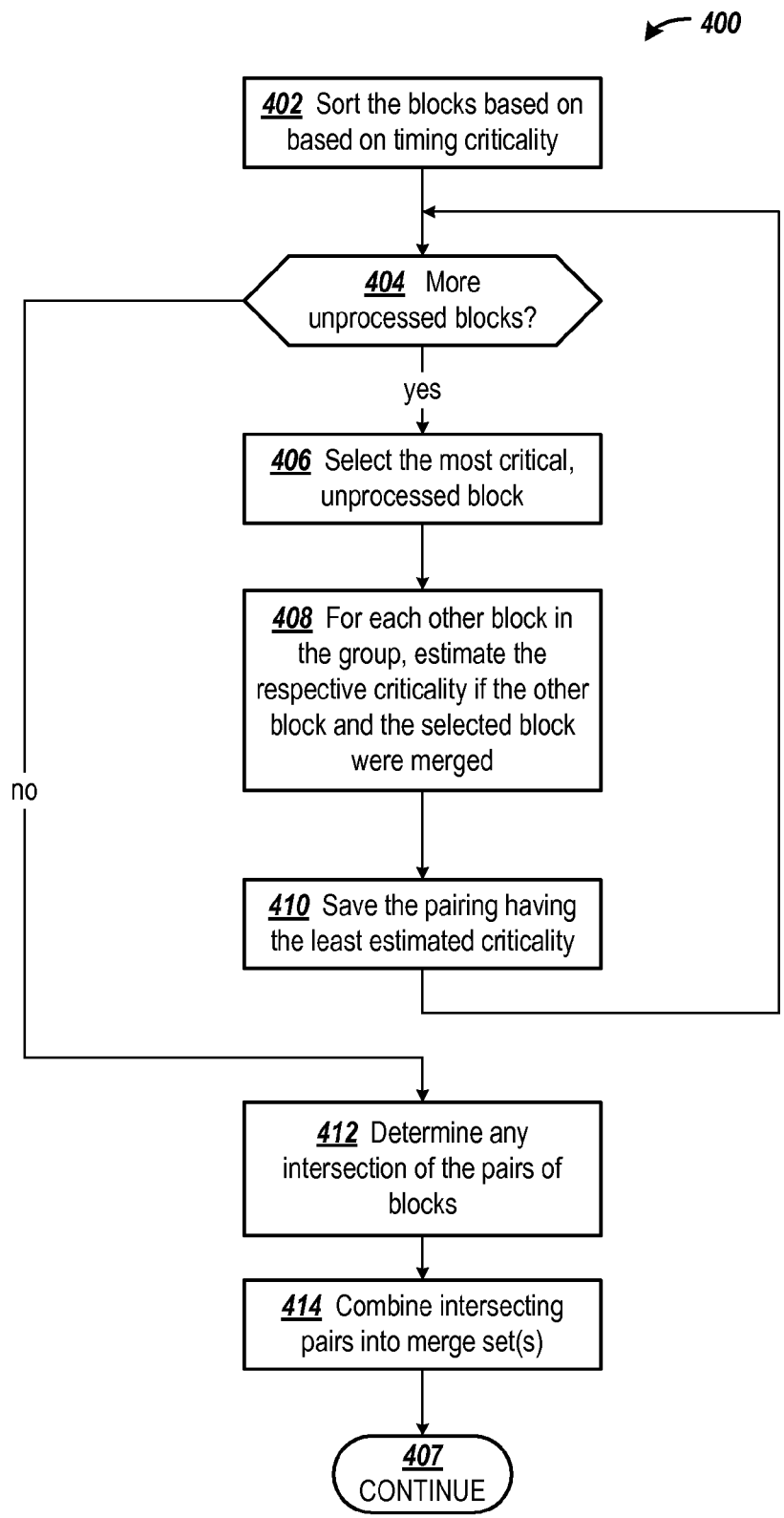
FIG. 4 is a flowchart of an example process that uses timing criticality of the equivalent circuit blocks in the constructing of merge sets within a group of equivalent logic blocks.

FIG. 4 is a flowchart of an example process 400 that uses timing criticality of the equivalent circuit blocks in the constructing of merge sets within a group of equivalent logic blocks. Therefore, FIG. 4 illustrates another example implementation of step 204 in FIG. 2. At step 402, the blocks in the group are sorted in order of timing criticality. In one embodiment, the timing criticality of a block is the worst slack value (e.g., the least value) of the slack values for all the input pins on a block.

Decision step 404 determines whether or not there are more unprocessed blocks in the group. If so, the process proceeds to step 406 where the most critical, unprocessed block in the group is selected. The most critical block may be the block having the least slack value. That selected block is then prospectively paired with each other block in the group, and for each prospective pairing step 408 estimates the respective timing criticality of a prospective merging of the paired blocks. For example, if the group included blocks b1, b2, b3, . . . b10, and b1 was selected as the most critical, unprocessed block, the process would generate respective timing criticality estimates for blocks resulting from the merging of the pairs, {b1, b2}, {b1, b3}, {b1, b4}, . . . {b1, b10}.

At step 410, the pairing having the least estimated criticality (i.e., the pairing that when prospectively merged produces a resulting block with the greatest slack value) is saved. The process then returns to decision step 404.

Once there are no more unprocessed blocks in the group (i.e., all the blocks in the group have been paired), decision step 404 directs the process to step 412 to process the pairings. Step 412 determines intersections of the pairs of blocks, and step 414 combines the intersecting pairs into merge sets (s). Consider the example with blocks b1 . . . b10 and the following resulting pairs: {b1,b2}, {b2,b1}, {b3,b10}, {b4, b10}, {b5,b2}, {b6,b10}, {b7,b3}, {b8,b9}, {b9,b8}, and {b10,b3}. The following pairs intersect: {b1,b2}, {b2,b1} and {b5,b2}; as do pairs: {b3,b10}, {b4,b10}, {b6,b10}, {b7,b3}, and {b10,b3}; as well as pairs: {b8,b9} and {b9,b8}. The groups of intersecting pairs are combined into respective merge sets. Continuing with the previous example, the following merge sets result: {b1,b2,b5}, {b3,b4,b6,b7,b10}, and {b8,b9}. Steps 412 and 414 may together be viewed as forming merge sets according to the following rule. The blocks in each pair together can be assigned to one and only one merge set, and if one block in a pair is already a member of a merge set then the other block of the pair is added to the merge set.

The process then continues with step 407, which continues the overall process of FIG. 2.

Figure 5A:
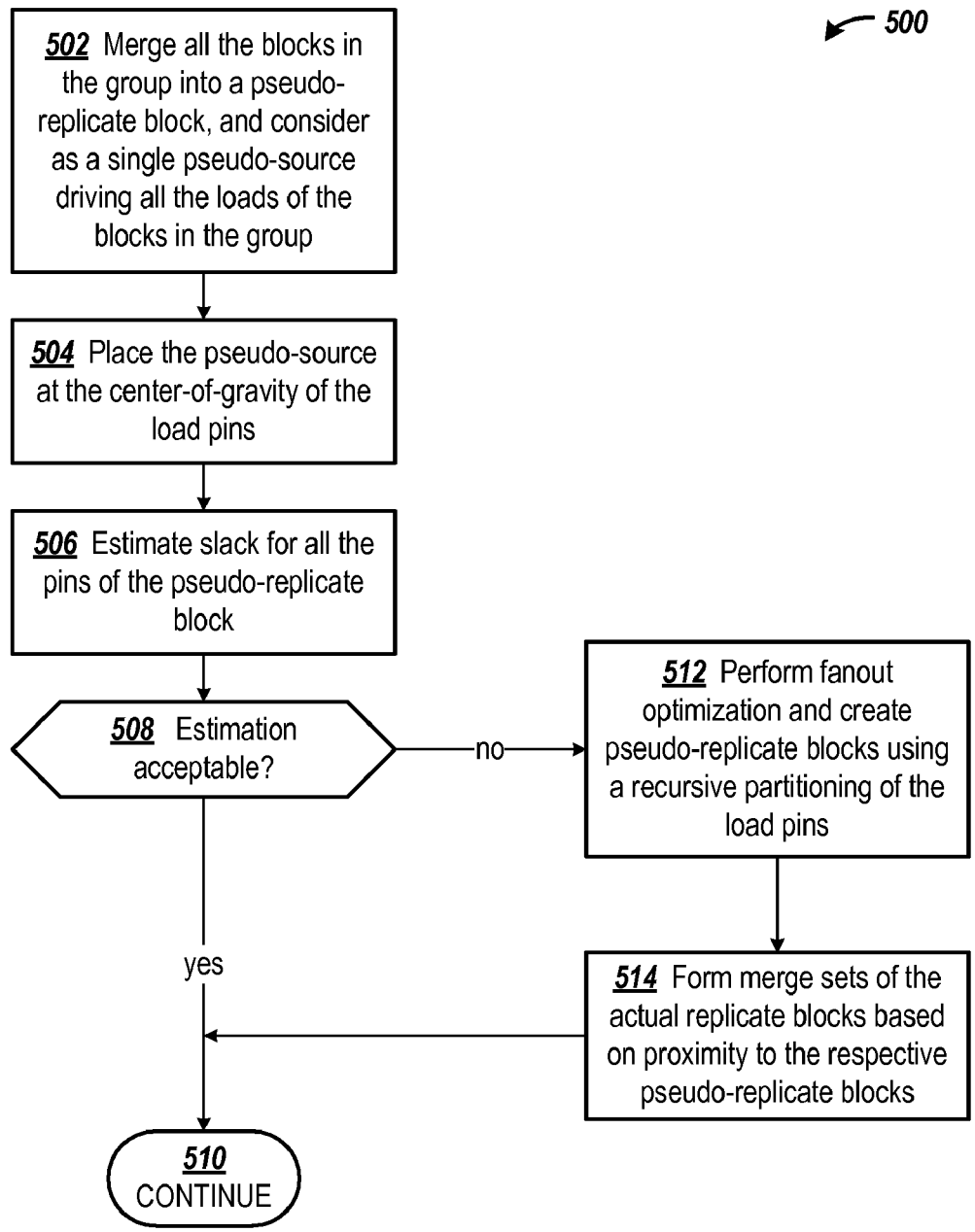
FIG. 5A is a flowchart of an example process that uses a pseudo-block in the constructing of merge sets within a group of equivalent circuit blocks.

FIG. 5A is a flowchart of an example process 500 that uses a pseudo-block in the constructing of merge sets within a group of equivalent circuit blocks. Therefore, FIG. 5A illustrates yet another example implementation of step 204 in FIG. 2. FIG. 5A is described in conjunction with the example shown in FIGS. 5B and 5C.

Figure 5B:
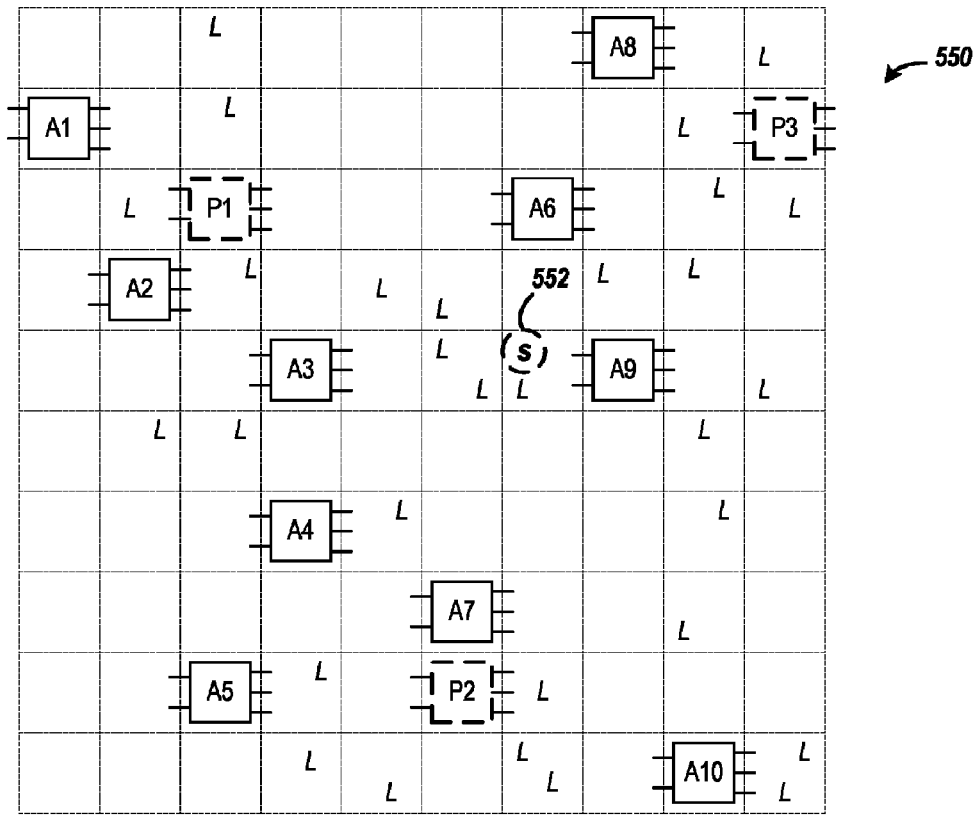
FIG. 5B shows an example placement grid with an example placed design including blocks and load pins.
Figure 5C:
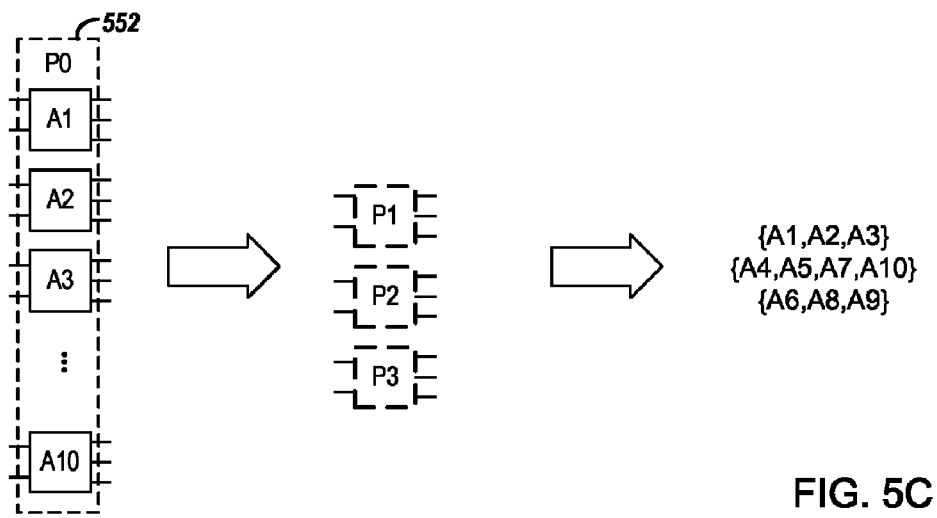
FIG. 5C shows an example single pseudo-replicate block being transformed into multiple pseudo-replicate blocks, from which merge sets are formed.

At step 502, the blocks in the group ("actual replicate blocks) are prospectively merged into a single pseudo-replicate block and considered as a single pseudo-source driving all of the load pins driven by output pins of the pseudo-replicate block. FIG. 5B illustrates an example placement grid 550 showing the placement relationship between actual replicate logic blocks A1-A10 and the single pseudo-replicate block 552. The actual replicate logic blocks A1-A10 are shown with input pins on the left side and output pins on the right side of the respective blocks. The load pins that are driven by the output pins of the actual replicate blocks A1-A10 are labeled, L. The connections from the blocks to the load pins are not shown, in order to avoid cluttering the diagram. FIG. 5C shows the single pseudo-replicate block 552, which includes all the actual replicate blocks in the group.

At step 504, the single pseudo-replicate block 552 is placed at the center of gravity (CG) of the load pins, L, of the actual replicate blocks. The CG can be calculated according to the placement of the load pins and reflect the connectivity of the entire block. For example, the CG can reflect the connectivity and timing criticality of each respective load pin as determined or measured from the source that drives the actual replicate logic block. The circuit design can be viewed as a grid overlaid upon the physical target device. The CG can be calculated for both the x-coordinate and the y-coordinate independently. The x-coordinate of the CG, denoted as CGx, can be calculated according to: $CGx = w_1 x_1 + w_2 x_2 + \ldots w_n x_n$, where $x_i$, represents the x-coordinate of each respective load pin Li, and $w_i$ represents the timing weight of each respective load pin Li.

More particularly, the timing weight $w_i$ can reflect the timing criticality of the load under question with respect to the load having the worst timing characteristics, e.g., worst slack. The timing weight $w_i$ provides a means of biasing so that the source is placed closer to the more timing critical, or the most timing critical, load pins. As is well known, "slack" refers to the difference between the timing requirement of a signal and an estimate of the propagation time for that signal. A negative slack indicates a timing critical signal, e.g., one that is not meeting the established timing requirement. A positive slack indicates a signal that is exceeding a timing requirement. A slack of zero indicates a signal that is exactly meeting its timing requirement. The CG equation can reflect the connectivity of the entire single pseudo-replicate block 552, including the connectivity of each respective load pin as determined or measured from the source that drives the single pseudo-replicate block 552. The y-coordinate of the CG for a window, denoted as $CG_y$, can be computed in similar fashion.

Using the placed single pseudo-replicate block 552, at step 506 the slack values are estimated for all of the load pins driven by the single pseudo-replicate block 554. The slack values are based on placement of the single pseudo-replicate block 552 relative to the load pins, L. The slack values are stored in association with the pseudo-replicate block 552.

If the estimated slack values are acceptable (decision step 508), for example, if all the slack values are positive, then the merge set includes all the blocks in the group of equivalent logic blocks, and the process continues at step 510, which continues the overall process of FIG. 2. Otherwise, the process continues at step 512 where the single pseudo-replicate block is in effect divided into multiple pseudo-replicate blocks using fanout optimization and recursive partitioning of the load pins.

In an example implementation, the partitioning of the load pins may be accomplished by overlaying a rectangular window on the example placement grid 550 and recursively dividing the window into smaller windows until each smaller window contains no more than a desired number of load pins. Once a window is small enough to encompass no more than the desired number of load pins, the recursive division of that window stops. The load pins are then effectively partitioned according to the smallest encompassing windows. Respective pseudo-replicate blocks are created for the partitions of load pins, and the respective pseudo-replicate blocks are placed at the CG of the partitions of load pins.

In FIGS. 5B and 5C, the respective pseudo-replicate blocks are labeled P1-P3 and are shown as blocks with dashed lines. The placement of respective pseudo-replicate blocks P1-P3 in grid 550 is for purposes of general illustration. An actual placement based on the load pins may vary from that shown in FIG. 5B. However, an actual placement is unnecessary for understanding the embodiments of the invention.

At step 514, merge sets of the actual replicate blocks (e.g., A1-A10) are formed based on the proximity of each replicate block to one of the respective pseudo-replicate blocks (e.g., P1-P3). For example, for each respective pseudo-replicate block there is a merge set created, and each actual replicate block is assigned to the merge set of the respective pseudo-replicate block to which the actual replicate block is closest. In the example of FIGS. 5B and 5C, the respective pseudo-replicate block P1 produces the merge set {A1, A2, A3}; P2 produces the merge set {A4, A5, A7, A10}; and P3 produces the merge set {A6, A8, A9}. Once the merge sets are formed and stored, the process continues at step 510, which continues the general process of FIG. 2.

Figure 6A:
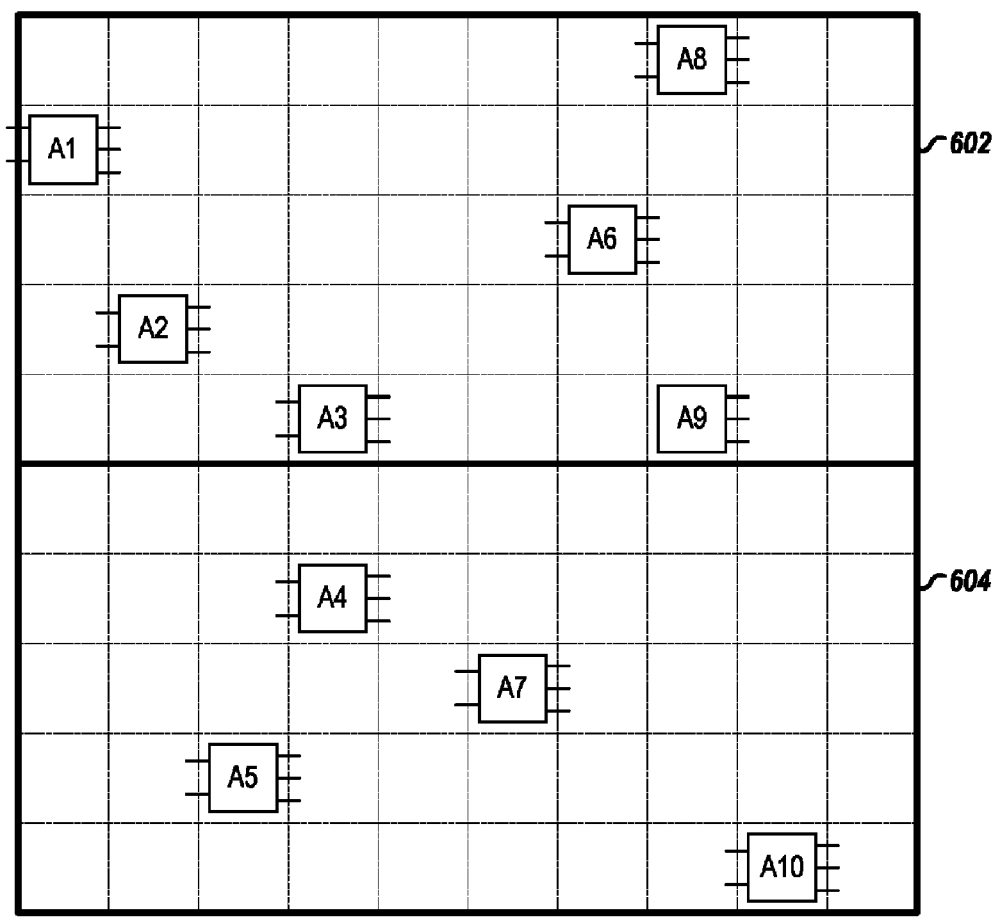
FIGS. 6A-6C show a sequence of recursively determined windows from which merge sets are determined according to yet another embodiment for determining the merge sets.
Figure 6B:
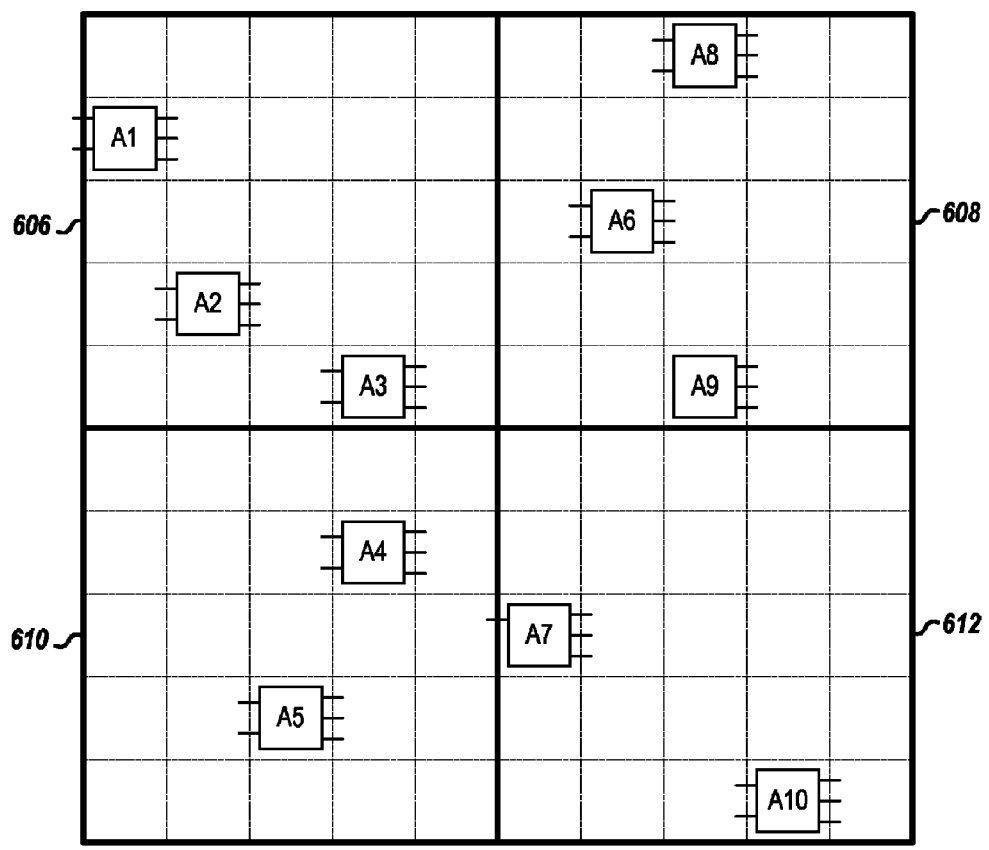
Figure 6C:
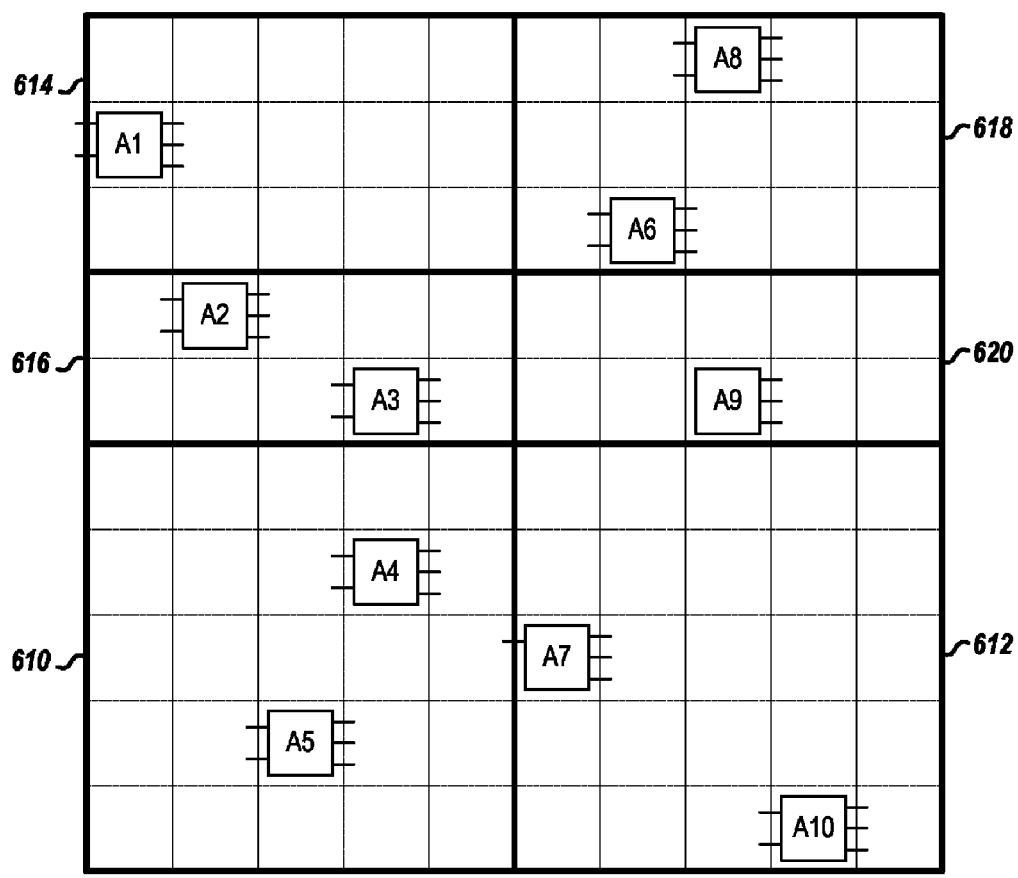

FIGS. 6A-6C show a sequence of recursively determined windows from which merge sets are determined, according to yet another embodiment for determining the merge sets. Generally, the blocks within a window are prospectively merged. If the total fanout of the block resulting from the prospective merge is less than a desired threshold, then recursive division of that window stops. If the total fanout of the resulting block is greater than the desired threshold, that window is recursively divided into sub-windows, and the blocks in each of those sub-windows are prospectively merged as described above. Once recursive division of a window stops, a merge set is formed to include the blocks within that window.

FIG. 6A shows an initial window that has been divided into two windows, 602 and 604. If the total fanout of the block resulting from merging blocks A1, A2, A3, A6, A8, and A9 in window 602 is exceeded, the window 602 is divided into two further windows 606 and 608, as shown in FIG. 6B, and the total fanout is checked for a merging of blocks in each of those windows. Similarly, if the total fanout of the block resulting from merging of blocks A4, A5, A7, and A10 in window 604 is exceeded, window 604 is divided into two further windows 610 and 612, as shown in FIG. 6B. The total fanout of a block resulting from merging the blocks in a window is equal to the product of the number of equivalent blocks and the number of output pins of an individual replicate block. In the example window 602, the total fanout is 18.

Continuing the example with FIG. 6B, if the total fanout threshold is not exceeded by a merging of blocks A4 and A5 in window 610, then recursive division of window 610 stops, and the merge set for window 610 includes blocks A4 and A5. Similarly, if the total fanout threshold is not exceeded by a merging of blocks A7 and A10 in window 612, then recursive division of window 612 stops, and the merge set for window 612 includes blocks A7 and A10.

If the total fanout threshold is exceeded by a merging of blocks A2, A2, and A3 in window 606, window 606 is divided into windows 614 and 616, as shown in FIG. 6C. Windows 618 and 620 are similarly determined from the blocks in window 612 of FIG. 6B. The example assumes that the total fanout values of the respective blocks produced from the prospective merging of the blocks within windows 610, 612, 614, 616, 618, and 620 satisfy the total threshold. The merge sets resulting from the recursive division of windows are: {A1}, {A2, A3}, {A4, A5}, {A6, A8}, {A9}, and {A7, A10}.

Figure 7:
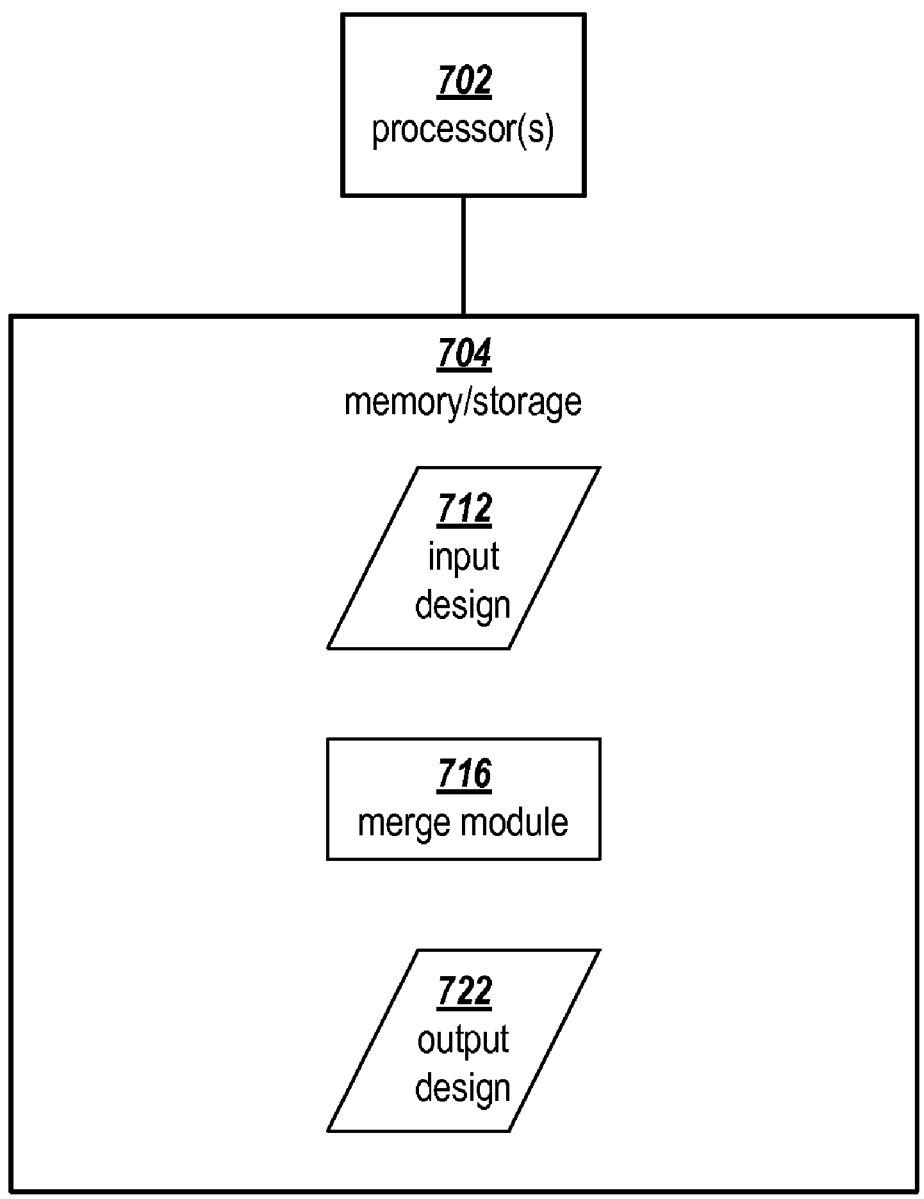
FIG. 7 is a block diagram of an example computing arrangement on which the processes described herein may be implemented.

FIG. 7 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. In addition, program code that implements the processes may be provided via a variety of computer-readable storage media or delivery channels such as magnetic or optical disks or tapes, electronic storage devices, for example.

Computing arrangement 700 includes one or more processors 702 coupled to a memory/storage arrangement 704. The architecture of the computing arrangement depends on implementation requirements, as would be recognized by those skilled in the art. The processor 702 may be one or more general purpose processors, or a combination of one or more general purpose processors and suitable co-processors, or one or more specialized processors (e.g., RISC, pipelined, etc.), for example.

The memory/storage arrangement 704 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement 702 executes the software stored in memory/storage arrangement 704, and reads data from and stores data to the memory/storage arrangement according to the processes described above. An operating system (not shown) manages the resources of the computing arrangement.

The merge module 716 generally determines groups of equivalent logic blocks from a placed, input design 712, and within each group determines which blocks to merge. Within a group, different combinations of blocks are considered for merging, and multiple subsets of blocks within a group may be merged depending on the desirability of those merges, as described above. In performing the processes described herein, the merge module stores the intermediate data, for example, representative of the merge sets, placement grid, pseudo-source block, pseudo-replicate blocks, etc. (not shown) in the memory/storage arrangement. The merge module stores the updated design resulting from the merging of equivalent blocks in the memory/storage arrangement.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for processing a circuit design, comprising:
    determining with a processor groups of placed, replicate logic blocks in a circuit design that is represented in a memory, wherein the replicate logic blocks in each group have equivalent logic, have corresponding input pins and corresponding output pins, and each set of corresponding input pins is coupled to a common source;
    determining with the processor, for the replicate logic blocks in each group, whether or not to merge replicate logic blocks in a subset of the replicate logic blocks into a respective single replacement logic block for the subset;
    replacing in the circuit design by the processor, in response to determining to merge the replicate logic blocks in the subset, the replicate logic blocks in the subset with the respective replacement logic block; and
    storing the circuit design having the replacement logic block in the memory by the processor.

2. The method of claim 1, wherein:
    the determining whether or not to merge includes comparing a cost function applied to the circuit design including the respective replacement logic block to the cost function applied to the circuit design without the replicate logic blocks of the subset being merged, the cost function having factors that include at least one of wire length, timing criticality, congestion, and power consumption; and
    the replicate logic blocks in the subset are replaced with the respective replacement logic block in response to the cost function applied to the circuit design including the respective replacement logic block being less than the cost function applied to the circuit design without the replicate logic blocks of the subset being merged.

3. The method of claim 1, further comprising:
    determining by the processor one or more subsets of replicate logic blocks in each group, wherein the total fanout of the replicate logic blocks in each subset is less than or equal to a threshold value; and
    wherein the determining whether or not to merge replicate logic blocks in a subset is performed for each of the one or more subsets.

4. The method of claim 3, wherein the determining one or more subsets includes for each subset:
    initializing an in-process subset as empty;
    adding a replicate logic block that is not yet assigned to any other subset to the in-process subset;
    testing whether or not adding to the in-process subset, an additional replicate logic block that is not yet assigned to any other subset, would increase the total fanout of the replicate logic blocks in the in-process subset beyond the threshold value;
    adding the additional replicate logic block to the in-process subset in response to the total fanout of the replicate logic blocks in the in-process subset including the additional replicate logic block being less than the threshold; and
    repeating the testing and adding of an additional replicate logic block until the adding an additional replicate logic block would increase the total fanout of the replicate logic blocks in the in-process subset beyond the threshold value.

5. The method of claim 1, further comprising:
    determining by the processor one or more subsets of replicate logic blocks in each group based in part on a least value of slack values of all input pins on a replicate logic block, pairings of each replicate logic block with another replicate logic block in the group, and intersections of the pairings,
    wherein the determining whether or not to merge replicate logic blocks in a subset is performed for each of the one or more subsets.

6. The method of claim 5, wherein the determining one or more subsets of replicate logic blocks includes:
    sorting the replicate logic blocks in the group by respective least slack values, wherein each respective least slack value is a least one of slack values of all input pins on a replicate logic block;
    selecting one unprocessed replicate logic block with the least slack value relative to each other unprocessed replicate logic block in the group
    forming a pair of the one replicate logic block with a second of the replicate logic blocks in the group such that a prospective logic block resulting from a prospective merging of the pair has a slack value that is greater than or equal to any other prospective merging of the one replicate logic block with any replicate logic block in the group other than the second;
    marking the one replicate logic block as processed;

repeating the selecting, forming, and marking steps until all the replicate logic blocks in the group are marked as processed; and
assigning each intersecting pair to a subset.

7. The method of claim 1, further comprising:
prospectively merging by the processor all the replicate logic blocks in a group into a single pseudo-replicate block, and determining slack values for all loads of the replicate logic blocks in the group as driven by the single pseudo-replicate block as placed at a center-of-gravity of the loads,
wherein for the determining whether or not to merge replicate blocks in a subset of the replicate logic blocks in a group, the subset is a single subset including all the replicate logic blocks in the group, in response to the slack values of the loads as driven by the single pseudo-replicate block being acceptable.

8. The method of claim 7, further comprising:
in response to the slack values of the loads as driven by the single pseudo-replicate block being unacceptable, recursively partitioning by the processor, the loads into a plurality of subsets of loads;
determining a respective center of gravity for each subset of loads by the processor; and
determining by the processor, one or more subsets of replicate logic blocks in each group based on distances from each respective center of gravity to each replicate logic block in the group.

9. The method of claim 1, further comprising:
recursively dividing by the processor, replicate logic blocks in each group into one or more subsets based on placement of the replicate logic blocks and total fanout of a prospective merging of replicate logic blocks in a subset being less than a threshold,
wherein the determining whether or not to merge replicate logic blocks in a subset is performed for each of the one or more subsets.

10. A system for processing a circuit design, comprising:
a processor; and
a memory arrangement coupled to the processor for storing a circuit design,
wherein the processor is programmed to perform steps including:
determining groups of placed, replicate logic blocks in the circuit design, wherein the replicate logic blocks in each group have equivalent logic, have corresponding input pins and corresponding output pins, and each set of corresponding input pins is coupled to a common source;
determining for the replicate logic blocks in each group, whether or not to merge replicate logic blocks in a subset of the replicate logic blocks into a respective single replacement logic block for the subset;
replacing in the circuit design, in response to determining to merge the replicate logic blocks in the subset, the replicate logic blocks in the subset with the respective replacement logic block; and
storing the circuit design having the replacement logic block.

11. An article of manufacture, comprising:
a processor-readable non-transitory storage medium configured with processor-executable instructions for processing a circuit design, the instructions when executed by a processor causing the processor to perform steps including:
determining groups of placed, replicate logic blocks in a circuit design, wherein the replicate logic blocks in each group have equivalent logic, have corresponding input pins and corresponding output pins, and each set of corresponding input pins is coupled to a common source;
determining for the replicate logic blocks in each group, whether or not to merge replicate logic blocks in a subset of the replicate logic blocks into a respective single replacement logic block for the subset;
replacing in the circuit design, in response to determining to merge the replicate logic blocks in the subset, the replicate logic blocks in the subset with the respective replacement logic block; and
storing the circuit design having the replacement logic block.

12. The article of manufacture of claim 11, wherein:
the determining whether or not to merge includes comparing a cost function applied to the circuit design including the respective replacement logic block to the cost function applied to the circuit design without the replicate logic blocks of the subset being merged, the cost function having factors that include at least one of wire length, timing criticality, congestion, and power consumption; and
the replicate logic blocks in the subset are replaced with the respective replacement logic block in response to the cost function applied to the circuit design including the respective replacement logic block being less than the cost function applied to the circuit design without the replicate logic blocks of the subset being merged.

13. The article of manufacture of claim 11, the steps further comprising:
determining by the processor, one or more subsets of replicate logic blocks in each group, wherein the total fanout of the replicate logic blocks in each subset is less than or equal to a threshold value,
wherein the determining whether or not to merge replicate logic blocks in a subset is performed for each of the one or more subsets.

14. The article of manufacture of claim 13, wherein the determining one or more subsets includes for each subset:
initializing an in-process subset as empty;
adding a replicate logic block that is not yet assigned to any other subset to the in-process subset;
testing whether or not adding to the in-process subset, an additional replicate logic block that is not yet assigned to any other subset, would increase the total fanout of the replicate logic blocks in the in-process subset beyond the threshold value;
adding the additional replicate logic block to the in-process subset in response to the total fanout of the replicate logic blocks in the in-process subset including the additional replicate logic block being less than the threshold; and
repeating the testing and adding of an additional replicate logic block until the adding an additional replicate logic block would increase the total fanout of the replicate logic blocks in the in-process subset beyond the threshold value.

15. The article of manufacture of claim 11, the steps further comprising:
determining by the processor, one or more subsets of replicate logic blocks in each group based in part on a least value of slack values of all input pins on a replicate logic block, pairings of each replicate logic block with another replicate logic block in the group, and intersections of the pairings, wherein the determining whether or not to merge replicate logic blocks in a subset is performed for each of the one or more subsets.

16. The article of manufacture of claim 15, wherein the determining one or more subsets of replicate logic blocks includes:
   sorting the replicate logic blocks in the group by respective least slack values, wherein each respective least slack value is a least one of slack values of all input pins on a replicate logic block;
   selecting one unprocessed replicate logic block with the least slack value relative to each other unprocessed replicate logic block in the group
   forming a pair of the one replicate logic block with a second of the replicate logic blocks in the group such that a prospective logic block resulting from a prospective merging of the pair has a slack value that is greater than or equal to any other prospective merging of the one replicate logic block with any replicate logic block in the group other than the second;
   marking the one replicate logic block as processed;
   repeating the selecting, forming, and marking steps until all the replicate logic blocks in the group are marked as processed; and
   assigning each intersecting pair to a subset.

17. The article of manufacture of claim 11, the steps further comprising:
   prospectively merging by the processor all the replicate logic blocks in a group into a single pseudo-replicate block, and determining slack values for all loads of the replicate logic blocks in the group as driven by the single pseudo-replicate block as placed at a center-of-gravity of the loads,
   wherein for the determining whether or not to merge replicate blocks in a subset of the replicate logic blocks in a group, the subset is a single subset including all the replicate logic blocks in the group, in response to the slack values of the loads as driven by the single pseudo-replicate block being acceptable.

18. The article of manufacture of claim 17, the steps further comprising:
   in response to the slack values of the loads as driven by the single pseudo-replicate block being unacceptable, recursively partitioning by the processor, the loads into a plurality of subsets of loads;
   determining a respective center of gravity for each subset of loads by the processor; and
   determining by the processor, one or more subsets of replicate logic blocks in each group based on distances from each respective center of gravity to each replicate logic block in the group.

19. The article of manufacture of claim 11, further comprising:
   recursively dividing by the processor, replicate logic blocks in each group into one or more subsets based on placement of the replicate logic blocks and total fanout of a prospective merging of replicate logic blocks in a subset being less than a threshold,
   wherein the determining whether or not to merge replicate logic blocks in a subset is performed for each of the one or more subsets.

\* \* \* \* \*